United States Patent
Takezaki et al.

(10) Patent No.: US 7,479,013 B2
(45) Date of Patent: Jan. 20, 2009

(54) PRINTED BOARD AND MANUFACTURING METHOD THEREOF

(75) Inventors: Masanori Takezaki, Toyohashi (JP); Masayuki Komaru, Toyohashi (JP); Haruki Nitta, Toyohashi (JP); Takafumi Yagi, Toyohashi (JP); Yoshiyuki Mizuno, Toyohashi (JP)

(73) Assignee: U-AI Electronics Corporation, Aichi (JP)

( * ) Notice: Subject to any disclaimer, the term of this patent is extended or adjusted under 35 U.S.C. 154(b) by 0 days.

(21) Appl. No.: 11/792,611

(22) PCT Filed: Feb. 28, 2005

(86) PCT No.: PCT/JP2005/003304

§ 371 (c)(1),
(2), (4) Date: Sep. 4, 2007

(87) PCT Pub. No.: WO2006/061916

PCT Pub. Date: Jun. 15, 2006

(65) Prior Publication Data

US 2008/0076276 A1    Mar. 27, 2008

(30) Foreign Application Priority Data

Dec. 8, 2004    (JP) .............................. 2004-355203

(51) Int. Cl.
*H01R 12/00* (2006.01)

(52) U.S. Cl. ........................................ 439/55; 361/751
(58) Field of Classification Search ............ 439/55, 439/65, 68, 74, 75; 361/748–751
See application file for complete search history.

(56) References Cited

U.S. PATENT DOCUMENTS

| 4,812,792 | A |   | 3/1989  | Leibowitz |
| 4,859,189 | A | * | 8/1989  | Petersen et al. ............... 439/66 |
| 5,261,155 | A | * | 11/1993 | Angulas et al. ............... 29/830 |
| 6,257,329 | B1 |  | 7/2001  | Balzano |

FOREIGN PATENT DOCUMENTS

| EP | 0600590      | 9/1993  |
| EP | 0691803      | 10/1996 |
| EP | 1111971      | 6/2001  |
| JP | 7-235781     | 9/1995  |
| JP | 11-40902     | 2/1999  |
| JP | 2003-8186    | 1/2003  |
| JP | 2004-179257  | 6/2004  |
| JP | 2004-228410  | 8/2004  |
| JP | 2004-289006  | 10/2004 |
| WO | WO 97/43882  | 11/1997 |

* cited by examiner

*Primary Examiner*—Khiem Nguyen
(74) *Attorney, Agent, or Firm*—Muramatsu & Associates (57) ABSTRACT

A printed board is able to cool an electronic component with high efficiency without requiring a heatsink for cooling the electronic component while preventing upsizing of the electronic device. A method for manufacturing such a printed board with high efficiency is also disclosed. Since a carbon layer principally made of carbon and having excellent heat conductivity is provided inside an insulator or on a surface of the insulator in a laminated form, heat generated by the electronic component when the electronic component is energized is conducted to the carbon layer, diffused through the carbon layer, and then radiated to the outside. Therefore, the heat generated by the electronic component can be reliably radiated by heat conduction to the carbon layer and heat diffusion through the carbon layer, thereby cooling the electric component with high efficiency.

13 Claims, 7 Drawing Sheets

(a) LAY-UP STEP(S1a)

(b) LAMINATION PRESS STEP(S1b)

(c) COPPER FOIL ELIMINATING STEP(S1c)

(d) HOLE MAKING STEP(S3)

PRINTED BOARD AND MANUFACTURING METHOD THEREOF

TECHNICAL FIELD

The present invention relates to a printed board and a manufacturing method thereof. In particular, the invention relates to a printed board that can cool an electronic component with high efficiency without requiring a heatsink for cooling the electronic component while preventing upsizing of the electronic device, and a method for manufacturing such a printed board.

BACKGROUND ART

Electronic components, such as a transistor and an integrated circuit (IC), packaged on a printed board generate high heat when energized. Therefore, methods for cooling heat generated by these electronic components have been important technologies in the field of electronic devices (for example, engine control unit for an automobile (ECU)). A typical one of methods for cooling an electronic component is a method for mounting a heatsink made of a material having excellent heat conductivity on a surface of the electronic component to be heated (see Patent Document 1). There is also a method for cooling a radiating fin using a cooling fan.

[Patent Document 1] Japanese Patent Application Laid-Open Publication No. H07-235781 (e.g., FIG. 2)

DISCLOSURE OF THE INVENTION

Problem to be Solved by the Invention

However, in recent years, thickness reduction and high-density packaging of electronic devices has rapidly been promoted so as to realize size and weight reduction thereof, which has caused a problem that sufficient space to mount a heatsink cannot be secured on a printed board. In other words, a heatsink must be enlarged to properly cool electronic components. Accordingly electronic devices are upsized as a whole. On the contrary, constructing a smaller heatsink reduces the heat radiation efficiency, failing to properly cool the electronic components.

To solve the above-mentioned problem, an object of the present invention is to provide a printed board that can cool an electronic component with high efficiency without requiring a heatsink for cooling the electronic component while preventing upsizing of the electronic device, and a method for manufacturing such a printed board with efficiency.

Means for Solving the Problem

To attain this object, a printed board according to the present invention, which includes an insulator made of an electrical insulating material and a wiring pattern formed on at least one surface of the insulator or on at least one surface of the insulator and inside the insulator and on which one or more electronic components are to be mounted, has a sheet-shaped carbon layer principally made of carbon and obtained by rolling. The carbon layer is provided at least inside the insulator in a laminated form. The carbon layer provided inside the insulator in a laminated form is obtained by previously covering both surfaces of a sheet-shaped carbon layer obtained by rolling with a covering layer made of the electrical insulating material and then interposing the carbon layer covered with the covering layer between the electrical insulating materials and crimping the carbon layer and the electrical insulating material.

According to the present invention, the printing board includes a heat receiving hole which is recessed or drilled in a thickness direction of the insulator. The heat receiving hole is connected to the carbon layer provided inside the insulator or on a surface of the insulator in a laminated form. The heat receiving hole has an opening that is formed so as to face a back surface of the electronic component. The heat receiving hole is filled with a metal paste or a carbon paste.

According to the present invention, the printing board includes a heat radiating hole which is recessed or drilled in a thickness direction of the insulator. The heat radiating hole is connected to the carbon layer provided inside the insulator or on a surface of the insulator in a laminated form. The heat radiating hole has an opening that is formed so as not to face a back surface of the electronic component by providing the opening on a surface opposite to a surface on which the electronic component is packaged or providing the opening in a position that does not overlap the electronic component when seen from above on a identical surface to the surface on which the electronic component is packaged. The heat radiating hole is filled with a metal paste or a carbon paste.

According to the printed board of the present invention, if the carbon layer is provided inside the insulator in a laminated form, the heat receiving hole and the heat radiating hole connected to the carbon layer are formed as one through hole in which the heat receiving hole and the heat radiating hole communicate to each other.

According to the printed board of the present invention, a top of the metal paste or carbon paste filling the heat receiving hole is raised from a surface of the insulator so as to reduce a gap between the metal paste or carbon paste and a back surface of the electronic component.

According to the printed board of the present invention, a top of the metal paste or carbon paste filling the heat receiving hole is raised from a surface of the insulator so as to be approximately as high as or slightly higher than the wiring pattern so that the top can directly or indirectly make contact with a back surface of the electronic component.

The printed board further includes a heat receiving pattern formed on a surface of the insulator so as to face a back surface of the electronic component. The heat receiving pattern is coupled to a plurality of metal pastes or carbon pastes filling the heat receiving hole. The heat receiving pattern is formed approximately in a form of a plane over a range including the plurality of metal pastes or carbon pastes when seen from above.

According to the printed board of the present invention, at least a part of the carbon layer provided inside the insulator in a laminated form is formed so as to extend out from a peripheral edge of the insulator.

According to the printed board of the present invention, the wiring pattern includes a ground pattern coupled to a ground. The ground pattern and the carbon layer are electrically coupled to each other.

According to the printed board of the present invention, a part or all of the heat radiating hole is recessed or drilled in the thickness direction of the insulator while penetrating the ground pattern. The ground pattern and the carbon layer are electrically coupled to each other via the metal paste or carbon paste filling the heat radiating hole.

According to a printed board of the present invention, the carbon layer is provided over an almost region inside the insulator or on a surface of the insulator in a laminated form except for proximity of the wiring pattern when the wiring pattern is formed inside the insulator. Further, in the printed board according to the present invention, a conduction hole for electrically coupling the wiring pattern layers provided so as to be insulated from each other by interposition of the insulator is provided. The carbon layer provided inside the insulator in a laminated form is obtained by previously covering both surfaces of a sheet-shaped carbon layer obtained by rolling with a covering layer made of the electrical insulating material by crimping and making a hole having a circumference larger than a circumference of the conduction hole at a position corresponding to the conduction hole, and then interposing the carbon layer in which the hole is made between the electrical insulating materials and crimping the carbon layer and the electrical insulating material. According to the further aspects of the present invention, the carbon layer is a carbon layer obtained by filling a gap in a network knitted from a heat conductive material with a material principally made of carbon.

A printed board manufacturing method according to the present invention which is a method for manufacturing a printed board including a board-shaped insulator made of an electrical insulating material, a wiring pattern layer provided on at least one surface of the insulator or wiring pattern layers provided on at least one surface of the insulator and inside the insulator, a conduction hole for electrically coupling the wiring pattern layers provided so as to be insulated from each other by interposition of the insulator, and at least one layer of board-shaped carbon-containing member principally made of carbon and provided in a laminated form separately from the wiring pattern layer by interposing the insulator between the carbon-containing member and the wiring pattern layer, includes a covered carbon-containing material forming step of forming a covered carbon-containing member whose both surfaces are covered with an electrical insulating material included in the insulator by crimping the electrical insulating material included in the insulator on both surfaces of the board-shaped carbon-containing member; a covered carbon-containing member hole making step of making a hole having a circumference larger than a circumference of the conduction hole at a position corresponding to the conduction hole of a covered carbon-containing member obtained in the covered carbon-containing member forming step; and a printed board-use laminated board forming step of forming a printed board-use laminated board by interposing an electrical insulating material included in the insulator between the covered carbon-containing member in which a hole having a circumference larger than a circumference of the conduction hole is made in the covered carbon-containing member hole making step, and the wiring pattern layer or a conductor layer for forming a wiring pattern, and then crimping the electrical insulating material, the covered carbon-containing material, and the wiring pattern layer or conductor layer.

According to a printed board manufacturing method of the present invention, the covered carbon containing member forming step includes a laminating step of laminating the electrical insulating material included in the insulator on both surfaces of the board-shaped carbon containing member and laminating, outside the electrical insulating material, a metal sheet made of metal that can be eliminated by etching; a crimping step of crimping the carbon containing member, the electrical insulating material, and the metal sheet laminated in the laminating step to obtain a laminated body; and a metal sheet eliminating step of eliminating the metal sheet by etching from a laminated board obtained by crimping in the crimping step to obtain the covered carbon containing member.

The printed board manufacturing method further includes an outer layer wiring pattern forming step of forming a wiring pattern serving as wiring pattern layer from the conductor layer provided on a surface of the insulator in a laminated board for printed board formed in the laminated board for printed board forming step; and a solder resist film forming step of forming a solder resist film on a wiring pattern formed in the outer layer wiring pattern forming step to obtain the printed board.

According to the printed board manufacturing method of the present invention, the printed board has a conduction hole for electrically coupling the wiring pattern layers provided so as to be insulated from each other by interposition of the insulator. The printed board manufacturing method according to claim 16 further includes a conduction hole making step of making the conduction hole on a laminated board for printed board formed in the laminated board for printed board forming step; and a conduction hole plating step of plating a conduction hole drilled in the conduction hole making step in order to electrically couple the wiring pattern layers insulated from each other by interposition of the insulator.

According to the printed board manufacturing method of the present invention, the printed board has a heat radiating cavity for coupling between the wiring pattern layer provided on a surface of the insulator and on which one or a plurality of electronic components are to be packaged and the carbon containing member. The printed board manufacturing method further includes a heat radiating cavity making step of making the heat radiating cavity in a laminated board for printed board formed in the laminated board for printed board forming step; and a heat radiating material filling step of filling a heat radiating hole drilled in the heat radiating cavity making step with a heat radiating material.

According to the printed board manufacturing method of the present invention, the board-shaped carbon containing member is a member obtained by filling a gap in a network knitted from a heat conductive material with a material principally made of carbon.

According to the printed board of the present invention, the carbon layer that is principally made of carbon and has excellent heat conductivity is provided at least inside the insulator in a laminated form. Therefore, heat generated by the electronic component when the electronic component is energized is conducted to the carbon layer, diffused inside the carbon layer, and then radiated to the outside. As a result, the electronic component is cooled. This is advantageous in that heat generated by the electronic component when the electronic component is energized can be radiated with reliability, thereby cooling the electric component with high efficiency. Further, the carbon layer provided inside the insulator in a laminated form is obtained by previously covering both surfaces of a sheet-shaped carbon layer obtained by rolling with a covering layer made of the electrical insulating material and then interposing the carbon layer covered with the covering layer between the electrical insulating materials and crimping the carbon layer and the electrical insulating material. Therefore, previously providing a covering layer on both surfaces of the carbon layer from whose edge carbon flakes are generally considered to be apt to drop off prevents carbon flakes from dropping off from the carbon layer when the printed board is manufactured. This is advantageous in that the rate of occurrence of faulty wiring due to dropping-off of carbon flakes is low.

The printed board according to the present invention, has the heat receiving hole coupled to the carbon layer, and the heat receiving hole is filled with a metal paste or a carbon paste having excellent heat conductivity. Therefore, heat generated by the electronic component when the electronic component is energized is mainly conducted to the carbon layer via the metal paste or carbon paste filling the heat receiving hole. This is advantageous in that heat generated by the electronic component can be conducted to the carbon layer via the metal paste or carbon paste with reliability and high efficiency. As a result, the electronic component can be cooled with high efficiency.

Further the opening of the heat receiving hole is formed so as to face the back surface of the electronic component. Therefore, heat generated by the electronic component is received by the heat receiving hole (metal paste or carbon paste). This is advantageous in that heat generated by the electronic component can be conducted to the carbon layer with reliability and high efficiency, thereby further improving the cooling efficiency of the electronic component accordingly.

According to the printed board of the present invention, there is provided the heat radiating hole connected to the carbon layer, and the heat radiating hole is filled with the metal paste or carbon paste having excellent heat conductivity. Therefore, at least a part of heat conducted to the carbon layer from the electronic component is radiated to the outside via the metal paste or carbon paste filling the heat radiating hole. This is advantageous in that heat conducted to the carbon layer from the electronic component can be radiated from the carbon layer to the outside via the metal paste or carbon paste in the heat radiating hole with reliability and high efficiency. As a result, the electronic component can be cooled with high efficiency.

Further the opening of the heat radiating hole is provided on the surface opposite to a surface on which the electronic component is packaged or is provided in a position that does not overlap the electronic component when seen from above on an identical surface to the surface on which the electronic component is packaged. Therefore, the opening of the heat radiating hole can be formed so as not to face the back surface of the electronic component. This is advantageous in that heating of the electronic component due to radiation of heat from the heat radiating hole (metal paste or carbon paste) can be reduced, thereby further improving the cooling efficiency of the electronic component.

According to the printed board of the present invention, a heat receiving hole and a heat radiating hole are formed as one through hole in which these holes communicate to each other. Therefore, these holes can be made in one process simultaneously, for example, by drilling. This is advantageous in that there is no need to perform separate processes to make these holes, that is, the process steps are simplified, thereby allowing the processing cost to be reduced.

According to the printed board of the present invention, the top of the metal paste or carbon paste filling the heat receiving hole is raised from the surface of the insulator so as to reduce the gap between the metal paste or carbon paste and the back surface of the electronic component. This is advantageous in that heat from the electronic component can be conducted to the heat receiving hole (metal paste or carbon paste) with reliability and high efficiency, thereby further improving the cooling efficiency of the electronic component accordingly.

According to the printed board of the present invention, the top of the metal paste or carbon paste filling the heat receiving hole is raised from the surface of the insulator so as to be approximately as high as or slightly higher than the wiring pattern so that the top can directly or indirectly make contact with a back surface of the electronic component. This is advantageous in that heat from the electronic component can be conducted to the heat receiving hole (metal paste or carbon paste) with reliability and high efficiency, thereby further improving the cooling efficiency of the electronic component accordingly.

According to the printed board of the present invention, a heat receiving pattern is formed on the surface of the insulator so as to face the back surface of the electronic component as well as to be coupled to a plurality of metal pastes or carbon pastes. The heat receiving pattern is formed approximately in a form of a plane over a range including the plurality of metal pastes or carbon pastes when seen from above. Therefore, heat from the electronic component is conducted to the heat receiving hole (carbon paste) via the heat receiving pattern. This is advantageous in that since the area receiving heat from the electronic component can be increased by the area of the heat receiving pattern, heat from the electronic component can be conducted to the metal paste or carbon paste with reliability and high efficiency, thereby further improving the cooling efficiency of the electronic component.

According to the printed board of the present invention, at least a part of the carbon layer provided inside the insulator in a laminated form is formed so as to extend out from the peripheral edge of the insulator. Therefore, at least a part of heat conducted from the electronic component to the carbon layer is radiated to the outside via the extending portion of the carbon layer that extends out from the peripheral edge of the insulating board. This is advantageous in that heat conducted from the electronic component to the carbon layer can be radiated to the outside via the extending portion of the carbon layer that extends out from the peripheral edge of the insulator with reliability and high efficiency, thereby cooling the electronic component with high efficiency.

The printed board of the present invention includes a ground pattern coupled to a ground. The ground pattern and the carbon layer are electrically coupled to each other. This is advantageous in that the area of the ground can be increased to stabilize the potential of the ground, thereby reducing influence of noise to stabilize the operation of the electronic component.

According to the printed board of the present invention, heat can be radiated from the carbon layer to the outside with reliability and high efficiency by the metal paste or carbon paste filling the heat receiving hole. Further the metal paste or carbon paste also acts as a route for electrically coupling the ground pattern and carbon layer. This is advantageous in that there is no need to separately provide a coupling route for electrically coupling the ground pattern and the carbon layer, thereby allowing the processing cost, material cost, or the like to be reduced.

Further, if the carbon layer is electrically isolated, the carbon layer may act as a capacitor, thereby negatively affecting the electronic component. In particular, if the area of the carbon layer is increased, this problem becomes remarkable. Therefore, coupling the carbon layer to the ground pattern (ground) as described above advantageously can avoid the carbon layer from acting as a capacitor, thereby reducing influence of the carbon layer on the electronic component.

According to the printed board of the present invention, in addition to the advantage demonstrated by the printed board described above, the carbon layer principally made of carbon is provided over an almost region inside the insulator or on a surface of the insulator in a laminated form. Therefore, so-called "shielding effect" can be obtained by such a carbon layer. This is advantageous in that electromagnetic waves generated by the electronic component can be prevented from being radiated to the outside or the electronic component can be prevented from being affected by external noise. Further, the carbon layer provided inside the insulator in a laminated form is obtained by previously covering both surfaces of a sheet-shaped carbon layer obtained by rolling with a covering layer made of the electrical insulating material and making a hole having a circumference larger than a circumference of the conduction hole at a position corresponding to the conduction hole for electrically coupling the wiring Pattern layers provided so as to be insulated from each other by interposition of the insulator, and then interposing the carbon layer in which the hole is made between the electrical insulating materials and crimping the carbon layer and the electrical insulating material. Therefore, carbon flakes are prevented from dropping off from the conduction hole because the covering layer is previously provided on both surfaces of the carbon layer from whose edge carbon flakes are generally considered to be apt to drop off. This is advantageous in that the rate of occurrence of faulty wiring due to dropping-off of carbon flakes is low. Further, the carbon layer is a layer obtained by filling a gap in a network knitted from a heat conductive material with a material principally made of carbon, thereby reinforcing the weak inter-carbon bonding with the network. Therefore, carbon flakes is prevented from dropping off from the edge of the carbon layer when the printed board is manufactured. This is advantageous in that occurrence of faulty wiring due to dropping-off of carbon flakes is reduced.

According to the printed board manufacturing method of the present invention, when manufacturing a printed board including a carbon containing member provided in a laminated form separately from the wiring pattern layer by interposing an insulator between the carbon containing member and wiring pattern, a covered carbon containing member that is a board-shaped carbon containing member previously covered with an electrical insulating material included in the insulator is used. The covered carbon containing member and the wiring pattern layer or a conductor layer for forming a wiring pattern are crimped in the printed board-use laminated board forming step via the electrical insulating material included in the insulator thereby forming a printed board-use laminated board.

Generally, a carbon containing member is apt to drop off carbon flakes from an edge thereof due to its weak carbon-to-carbon bonding force. When a large number of holes for avoiding the carbon containing member from making contact with a through hole in the printed board are made in the carbon containing member, carbon flakes are particularly apt to drop off. If carbon flakes drop off from the laminated carbon containing member in the process of manufacturing a printed board, the carbon flakes attach to a copper foil portion of the printed board or a wiring pattern portion of the inner layer core material. This causes a problem that a printed board having faulty wiring is manufactured.

As described above, according to the printed board manufacturing method of the present invention, the covered carbon-containing member, that is, the carbon-containing member previously covered with the electrical insulating material (covered carbon-containing member) is used. Therefore, carbon flakes are unlikely to drop off from an edge of the carbon-containing member. This is advantageous in that carbon flakes can be prevented from dropping off from the carbon-containing member in the printed board-use laminated board forming step, thereby reducing the rate of occurrence of faulty wiring in the manufactured printed board. Further, a hole having a circumference larger than a circumference of the conduction hole is made at a position corresponding to the conduction hole for electrically coupling the wiring pattern layers disposed so as to be insulated from each other by interposition of the insulator, on the covered carbon-containing member obtained in the covered carbon-containing member forming step, in the covered carbon-containing member hole-making step prior to the printed board-use laminated board forming step. Therefore, a contact between the conduction hole for electrically coupling the wiring pattern layers and the carbon-containing member is avoided. This is advantageous in that passage of current through the carbon-containing member independent of electrical coupling in the printed board can be prevented.

Note that the "electrical insulating material included in the insulator" may not be of one type. It may be of two types or more. In other words, in the printed board manufacturing method, the electrical insulating material with which the carbon containing member is covered in the laminated board for printed board forming step, and the electrical insulating material interposed between the covered carbon containing member and the wiring pattern layer or a conductor layer for forming a wiring pattern may be an identical electrical insulating material or different electrical insulating materials.

According to the printed board manufacturing method of the present invention, the covered carbon containing member formed in the covered carbon containing member forming step is obtained by, first in the laminating step, laminating the electrical insulating material on both surfaces of the board-shaped carbon containing member and laminating a metal sheet made of metal that can be eliminated by etching outside the electrical insulating material, then crimping these to form a laminated substance in the crimping step, and then etching the formed laminated substance to eliminate the metal sheet in the metal sheet eliminating step. This is advantageous in that using the metal sheet that can be eliminated by etching allows the covered carbon containing member to be easily manufactured.

According to the printed board manufacturing method of the present invention, a wiring pattern serving as a wiring pattern layer is formed from the conductor layer provided on the surface of the insulator in the laminated board for printed board formed in the laminated board for printed board forming step, in the outer layer wiring pattern forming step. Then, in the solder resist film forming step, a solder resist film is formed on the wiring pattern to obtain a printed board. This is advantageous in that a printed board having an excellent heat radiating characteristic can be obtained because the printed board has a carbon containing member in an inner layer thereof.

According to the printed board manufacturing method of the present invention, if the printed board has a conduction hole for electrically coupling the wiring pattern layers provided so as to be insulated from each other by interposition of the insulator, the conduction hole is made on a laminated board for printed board formed in the laminated board for printed board forming step, in the conduction hole making step. Then, in the conduction hole plating step, the conduction hole is plated to electrically couple the wiring pattern layers insulated from each other by interposition of the insulator. This is advantageous in that a multilayer printed board having an excellent heat radiating characteristic can be obtained because the printed board has a carbon containing member in an inner layer thereof.

According to the printed board manufacturing method of the present invention, if the printed board has a heat radiating cavity for coupling between the wiring pattern layer provided on a surface of the insulator and on which one or a plurality of electronic components are to be packaged and the carbon containing member, the heat radiating cavity is made in a laminated board for printed board formed in the laminated board for printed board forming step, in the heat radiating cavity making step. Then, in the heat radiating material filling step, a heat radiating cavity made in the heat radiating cavity making step is filled with a heat radiating material. Therefore, the printed board manufactured using this manufacturing method can conduct heat generated by the electronic component serving as a heat source to the carbon containing member with efficiency. This is advantageous in that a printed board that can radiate heat generated by the electronic component with high efficiency to cool the electronic component with high efficiency can be obtained.

According to the printed board manufacturing method of the present invention, the board-shaped carbon containing member is a member obtained by filling a gap in a network knitted from a heat conductive material with a material principally made of carbon. Therefore, the weak carbon-to-carbon bonds are reinforced with the network. This is advantageous in that carbon flakes can effectively be prevented from dropping off from the carbon containing member, thereby reducing the rate of occurrence of faulty wiring in the manufactured printed board.

DESCRIPTION OF SYMBOLS

1: PRINTED BOARD
2: ELECTRONIC COMPONENT
3: CONDUCTIVE PATTERN (WIRING PATTERN, WIRING PATTERN LAYER)
3a: COPPER FOIL LAYER (WIRING PATTERN, WIRING PATTERN LAYER, CONDUCTOR LAYER)
3b: PLATING LAYER (WIRING PATTERN, WIRING PATTERN LAYER
4: INSULATING BOARD (INSULATOR)
15: COVERING LAYER (INSULATOR)
4a: SCREWING HOLE
5, 50: CARBON SHEET (CARBON LAYER, CARBON CONTAINING MEMBER)
5a: OPENING (HOLE)
6: HEAT RECEIVING HOLE (HEAT RECEIVING HOLE, HEAT RECEIVING CAVITY)
7: HEAT RADIATING HOLE (HEAT RADIATING HOLE, HEAT RADIATING CAVITY)
8: CARBON PASTE (HEAT RADIATING MATERIAL)
9: HEAT RECEIVING PATTERN
9a: COPPER FOIL LAYER
9b: PLATING LAYER
10: GROUND PATTERN
11: PLATING LAYER
12: RESIST LAYER (SOLDER RESIST FILM)
50a: CARBON CONTAINING MATERIAL (MATERIAL PRINCIPALLY MADE OF CARBON)
50b: COPPER WIRE (HEAT CONDUCTIVE MATERIAL)
A: COVERED CARBON SHEET (COVERED CARBON CONTAINING MEMBER)
I: INNER CORE MATERIAL (WIRING PATTERN LAYER)
P: PREPREG (ELECTRICAL INSULATING MATERIAL)
Cu: COPPER FOIL LAYER (METAL SHEET)
TH: THROUGH HOLE (CONDUCTION HOLE)

BEST MODE FOR CARRYING OUT THE INVENTION

Figure 1:
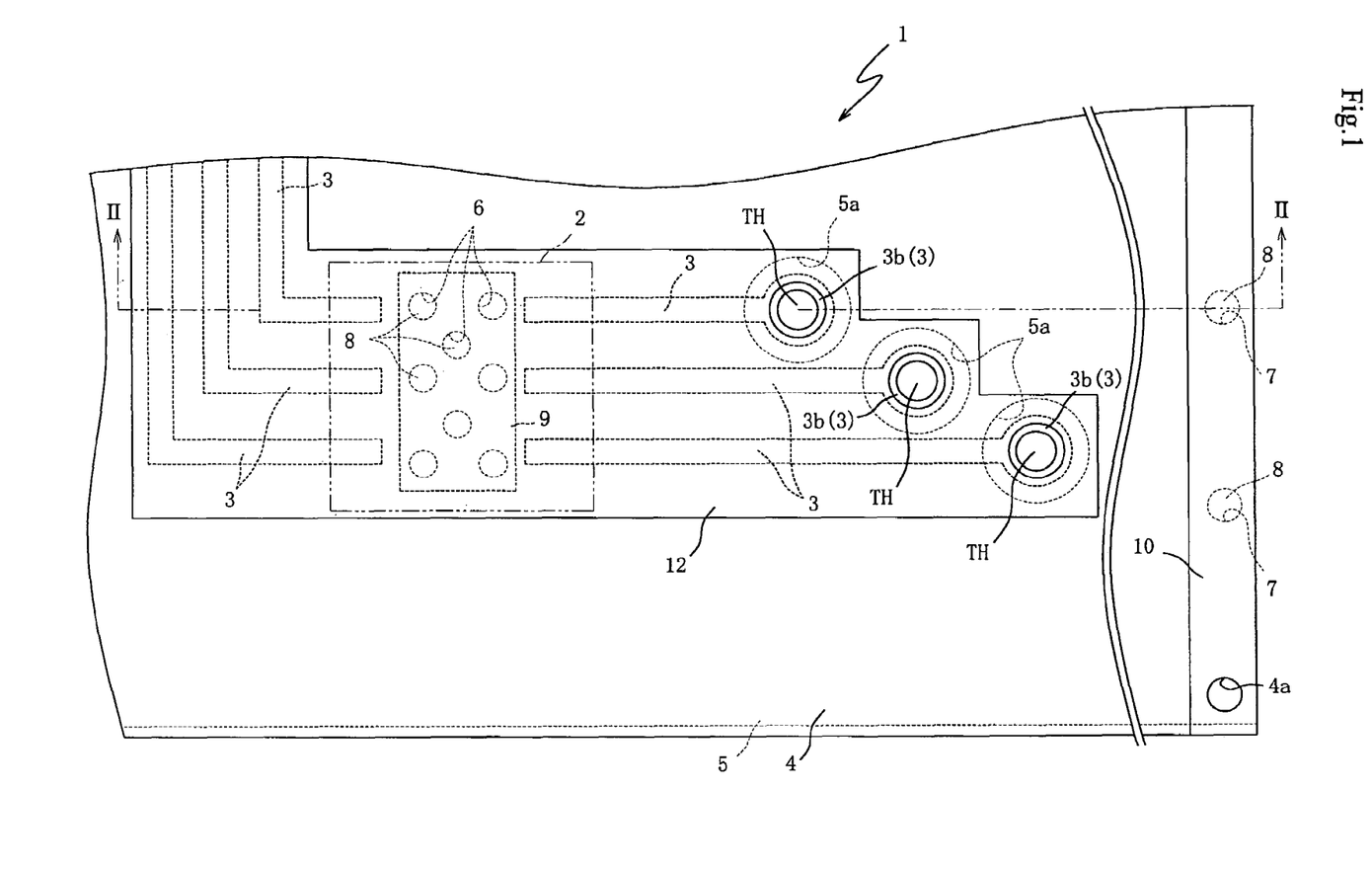
FIG. 1 is a top view of a printed board according to a first embodiment of the present invention.
Figure 2:
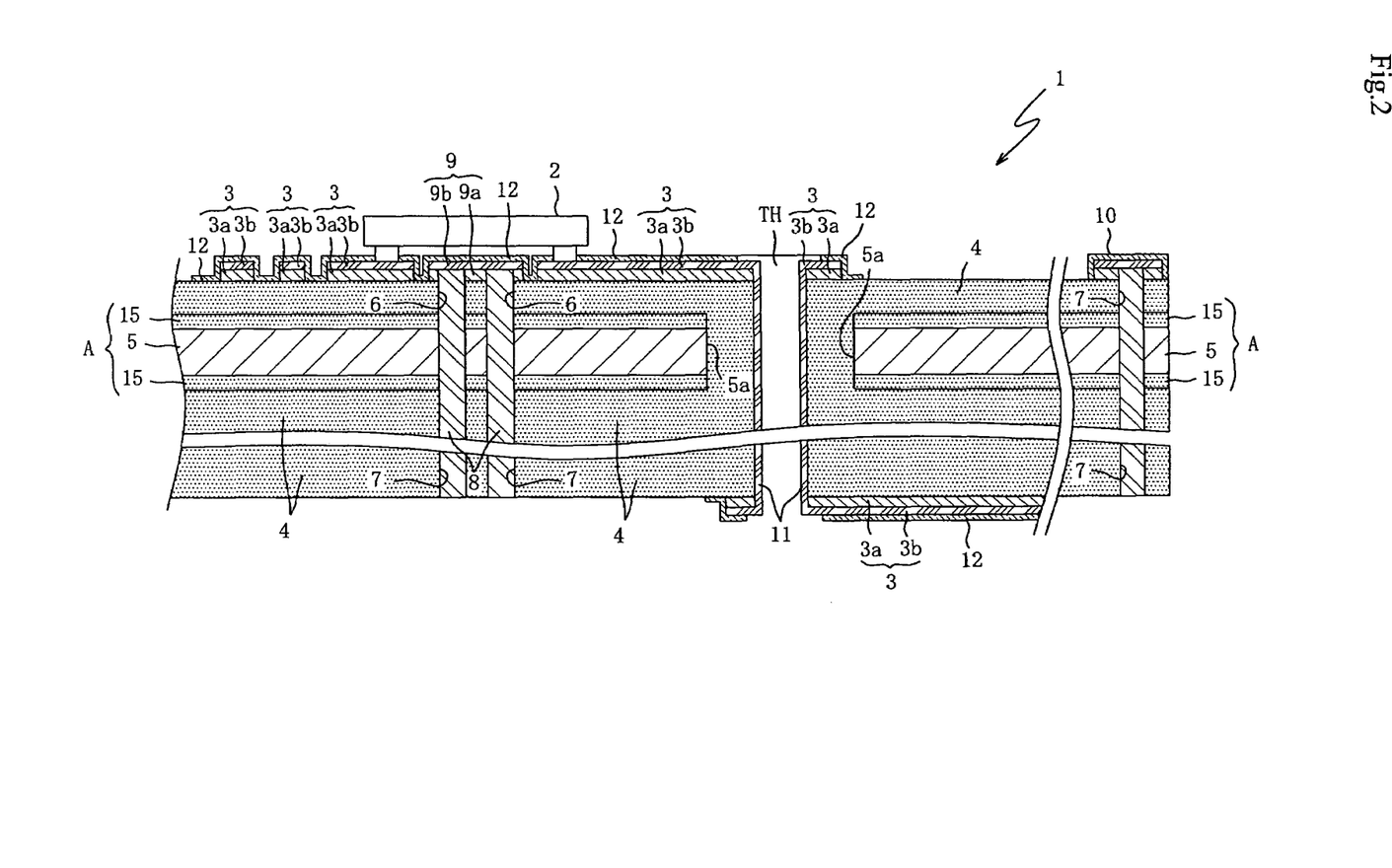
FIG. 2 is a sectional side view of the printed board taken along line II-II of FIG. 1.

Preferred embodiments of the present invention will be described below with reference to the accompanying drawings. FIG. 1 is a top view of a printed board 1 according to a first embodiment of the present invention. FIG. 2 is a sectional side view taken along line II-II of FIG. 1. In FIGS. 1 and 2, the printed board 1 is partially omitted. In FIG. 1, an electronic component 2 is not shown and its imaginary outline is shown using a chain double-dashed line.

The printed board 1 is, for example, a board included in an electronic device such as an engine control unit (ECU). It principally includes a plurality of electronic components 2 packaged on an upper surface thereof (toward a viewer from paper surface of FIG. 1, upper side in FIG. 2), a conductive pattern 3 for coupling these electronic components 2, an insulating board 4 on whose at least one surface (upper surface of the insulating board 4 in FIG. 2) the conductive pattern 3 is formed, and a carbon sheet 5 provided inside the insulating board 4 in a laminated form.

The electronic components 2 include a resistor, a capacitor, a transistor, and an integrated circuit, but are not limited to these components. The electronic components 2 include other electronic components that are generally packaged on a printed board.

The conductive pattern 3 is formed on at least one surface of the insulating board 4 (upper surface of the insulating board 4 in FIG. 2) as an electrical wiring circuit (corresponds to a "wiring pattern" in CLAIMS) for electrically coupling between the electronic components 2. It includes a copper foil layer 3a and a plating layer 3b stacked on the upper surface of the copper foil layer 3a. A surface of the conductive pattern 3 (copper foil layer 3a and plating layer 3b) is coated with a resist layer 12 so as to prevent the conductive pattern 3 from being short-circuited.

The conductive pattern 3 may be provided on the other surface of the insulating board 4 (lower surface of the insulating board 4 in FIG. 2) and/or inside the insulating board 4. If multilayered conductive patterns 3 are provided, a through hole TH through which the multilayered conductive patterns 3 are electrically coupled to each other is made in each layer of conductive pattern 3. Specifically the multilayered conductive patterns 3 are electrically coupled to each other via the plating layer 11 provided on the surface of the through hole TH.

The insulating board 4 is an approximately flat, insulating substance and is fixed to the housing (not shown) of an electronic apparatus by screwing using screw holes 4a made at fours corners thereof. The insulating board 4 is obtained by impregnating paper, glass cloth (woven cloth or nonwoven cloth), or the like with an insulating resin (epoxy resin in the present embodiment) and hardening the resin. A covering layer 15 serving as a surface layer of a covered carbon sheet A to be discussed later is formed as a part of the insulating board 4.

As shown in FIGS. 1 and 2, the insulating board 4 has a plurality of heat receiving holes 6 and heat radiating holes 7 each having an approximately circular section made in the board thickness direction (vertical direction in FIG. 2). The ends of the heat receiving holes 6 and heat radiating holes 7 are connected to the carbon sheet 5 to be discussed later. The heat receiving holes 6 are members for conducting heat generated by the electronic components 2 when the electronic components 2 are energized, to the carbon sheet 5 to be discussed later, while the heat radiating holes 7 are members for radiating heat of the carbon sheet 5 to the outside.

The heat receiving hole 6 are filled with carbon pastes 8 that are principally made of carbon and have excellent heat conductivity. Therefore, heat of the electronic components 2 when the electronic components 2 are energized can be conducted to the carbon sheet 5 to be discussed later via the carbon pastes 8 with reliability and high efficiency. Further, as shown in FIGS. 1 and 2, the openings of the heat receiving holes 6 (toward a viewer from the paper surface in FIG. 1, upper side in FIG. 2) are provided in positions that face the back surfaces (lower surface in FIG. 2) of the electronic components 2. Therefore, heat of the electronic components 2 can be conducted to the carbon sheet 5 with reliability and high efficiency.

Similarly the heat radiating holes 7 are also filled with the carbon pastes 8. Therefore, heat conducted from the electronic components 2 to the carbon sheet 5 can be radiated to the outside via the carbon pastes 8 with reliability and high efficiency. Further the openings of the heat radiating holes 7 (toward the back of paper surface of FIG. 1, lower side in FIG. 2) are provided so as not to face the back surfaces of the electronic components 2. This can prevent the electronic component 2 from being affected (heating of the electronic component 2) by the heat radiated from the heat radiating holes 7 (carbon pastes 8).

As shown in FIG. 2, the tops (upper side in FIG. 2) of the carbon pastes 8 that fill the heat receiving holes 6 are raised from a surface of the insulating board 4. The gaps between the carbon pastes 8 and the back surfaces (lower side in FIG. 2) of the electronic components 2 are made smaller accordingly. This allows the heat from the electronic components 2 to be conducted to the carbon pastes 8 with reliability and high efficiency, thereby further improving the cooling efficiency of the electronic components 2.

As shown in FIGS. 1 and 2, a heat receiving pattern 9 is formed in the proximity of the openings of the heat receiving holes 6, in other words, in the range corresponding to the back surfaces of the electronic components 2. The heat receiving pattern 9 is a pattern for receiving heat from the electronic components 2 and conducting the heat to the carbon pastes 8 in the heat receiving holes 6. As shown in FIG. 1, the heat receiving pattern 9 is formed over a wide range including the plurality of carbon pastes 8 that fill the heat receiving holes 6 when seen from above. The carbon pastes 8 are coupled to each other via the heat receiving pattern 9.

As a result, the area that receives heat from the electronic components 2 can be increased by the area of the heat receiving pattern 9. Further the heat received by the heat receiving pattern 9 is diffused inside the heat receiving pattern 9 and conducted to the carbon pastes 8. Therefore the heat from the electronic components 2 can be conducted to the carbon pastes 8 with reliability and high efficiency, thereby further improving the cooling efficiency of the electronic components 2.

Further, as with the conductive pattern 3 described above, the heat receiving pattern 9 includes a copper foil layer 9a, a plating layer, and the resist layer 12. Therefore it can be formed in an identical process step to the one in which the conductive pattern 3 is formed. In other words, no additional process step is required to form the heat receiving pattern 9. The manufacturing cost can be reduced accordingly.

The tops of the carbon pastes 8 that fill the heat receiving holes 6 may be raised from the insulating board 4 so as to make contact with the back surfaces of the electronic components 2 (lower surface in FIG. 2). This allows the heat from the electronic components 2 to be conducted to the carbon pastes 8 with reliability and high efficiency. In this case, the carbon pastes 8 may directly make contact with the back surfaces of the electronic components 2 or indirectly make contact with the back surfaces of the electronic components 2 via the heat receiving pattern 9.

The carbon pastes 8 are obtained by mixing methanol with carbon powder and a phenol resin serving as a binder into a paste form substance, filling the holes 6 and 7 with the paste form substance, and hardening the substance. In this case, carbon powder having a particle diameter of 20 μm or less is preferably used. As a matter of course, other resins and/or solvents can be used instead of phenol and methanol.

The carbon sheet 5 is a sheet-shaped substance that is principally made of carbon and has excellent heat conductivity. As shown in FIGS. 1 and 2, the carbon sheet 5 is provided inside the insulating board 4 in a laminated form while extending over the almost entire insulating board 4. Therefore, heat generated by the electronic components 2 when the electronic components 2 are energized is conducted to the carbon sheet 5 via the above-mentioned heat receiving holes 6 (carbon pastes 8) and diffused inside the carbon sheet 5, whereby the heat is diffused to the entire region of the printed board 1.

As a result, with respect to the heat distribution in the printed board 1, it is unlikely that only the proximity of the electronic components 2 is heated to an extreme high temperature, unlike in related art printed boards. Since heat in the proximity of the electronic components 2 is transferred in four directions due to heat diffusion by the carbon sheet 5, the heat can be distributed more smoothly in the entire printed board 1. The peak (absolute value) of heat in the proximity of the electronic components 2 can be lowered accordingly.

Further, the carbon sheet 5 is formed such that an edge thereof extends out from a peripheral edge (right side in FIG. 2) of the insulating board 4. Therefore, heat can be radiated to the outside not only from the above-mentioned heat radiating holes 7 (carbon pastes 8) but also from such an extending portion with high efficiency.

As a result, the electronic components 2 can properly be cooled, making it unnecessary to provide an additional heatsink for cooling the electronic components 2. Therefore, the packaging density of the electronic components 2 in the limited space on the printed board can be increased accordingly, thereby downsizing the entire electronic apparatus. It is also possible to reduce the component count to reduce the component cost and/or assembly cost.

Further, providing the carbon sheet 5 in a laminated form in a wide range covering the almost entire inside (inner layer) of the insulating board 4 allows a shielding effect to be obtained. This can prevent electromagnetic waves generated by the electronic components 2 from being radiated to the outside or the electronic components 2 from being affected by external noise.

The printed board 1 has a ground pattern 10 formed thereon. The carbon sheet 5 is electrically coupled to the ground pattern 10. Therefore, the capacity (area) of the ground pattern 10 can be increased accordingly, stabilizing the potential of the ground. This reduces influence of noise on the electronic components 2, stabilizing operation of the electronic components 2. The ground pattern 10 is coupled to the ground via a screw fit to the screw hole 4a by screwing.

If the carbon sheet 5 is electrically isolated, it may act as a capacitor and negatively affect the electronic components 2. In particular, when the area of the carbon sheet 5 is increased so as to obtain a shielding effect as described above, this problem becomes remarkable. Therefore, electrically coupling the carbon sheet 5 to the ground pattern 10 (ground) can avoid the carbon sheet 5 from acting as a capacitor, reducing negative influence of the carbon sheet 5 on the electronic components 2.

As shown in FIGS. 1 and 2, coupling between the ground pattern 10 and carbon sheet 5 is made by the carbon paste 8 that fills the heat radiating hole 7. In other words, the carbon paste 8 serves as both a heat conduction route for heat radiation and an electrical coupling route. This allows the heat of the carbon sheet 5 to be radiated to the outside with reliability and high efficiency, as well as eliminates the need to provide an additional coupling route for electrically coupling the carbon sheet 5 and ground pattern 10. Therefore, the processing cost, material cost, or the like can be reduced accordingly.

The carbon sheet 5 is a sheet made of only carbon. What can be used as the carbon sheet 5 include an expanded carbon sheet obtained by acidizing, expanding, and rolling natural graphite into a sheet and a graphite sheet obtained by carbonizing a resin sheet at a high temperature of 2000° C. or more.

The carbon sheet 5 is apt to drop off carbon flakes from an edge thereof (peripheral edge or edge of opening 5a) due to weak carbon-to-carbon bonds. Therefore, as described later, when manufacturing the printed board 1 according to the first embodiment, the carbon sheet 5 is crimped along with other materials in the state of a covered carbon sheet A covered with a covering layer 15 made of a material (insulating material) containing an electrical insulating resin included in the insulating board 4. Using the carbon sheet 5 covered with the covering layer 15 can prevent carbon flakes from dropping off from an edge thereof. This can prevent faulty wiring from occurring in the printed board due to a dropped-off carbon flake.

As shown FIGS. 1 and 2, the carbon sheet 5 has an opening 5a having an approximately circular shape when seen from above. This avoids the carbons sheet 5 from making contact with the plating layer 11 provided on the surface of the through hole TH. Therefore, a current carried via the plating layer 11 is prevented from passing through the carbon sheet 5.

A method for manufacturing the printed board 1 having the above-mentioned structure now will be described referring to FIGS. 3 to 5. In the following description, it is assumed that the printed board 1 is a four-layer printed board.

Figure 3:
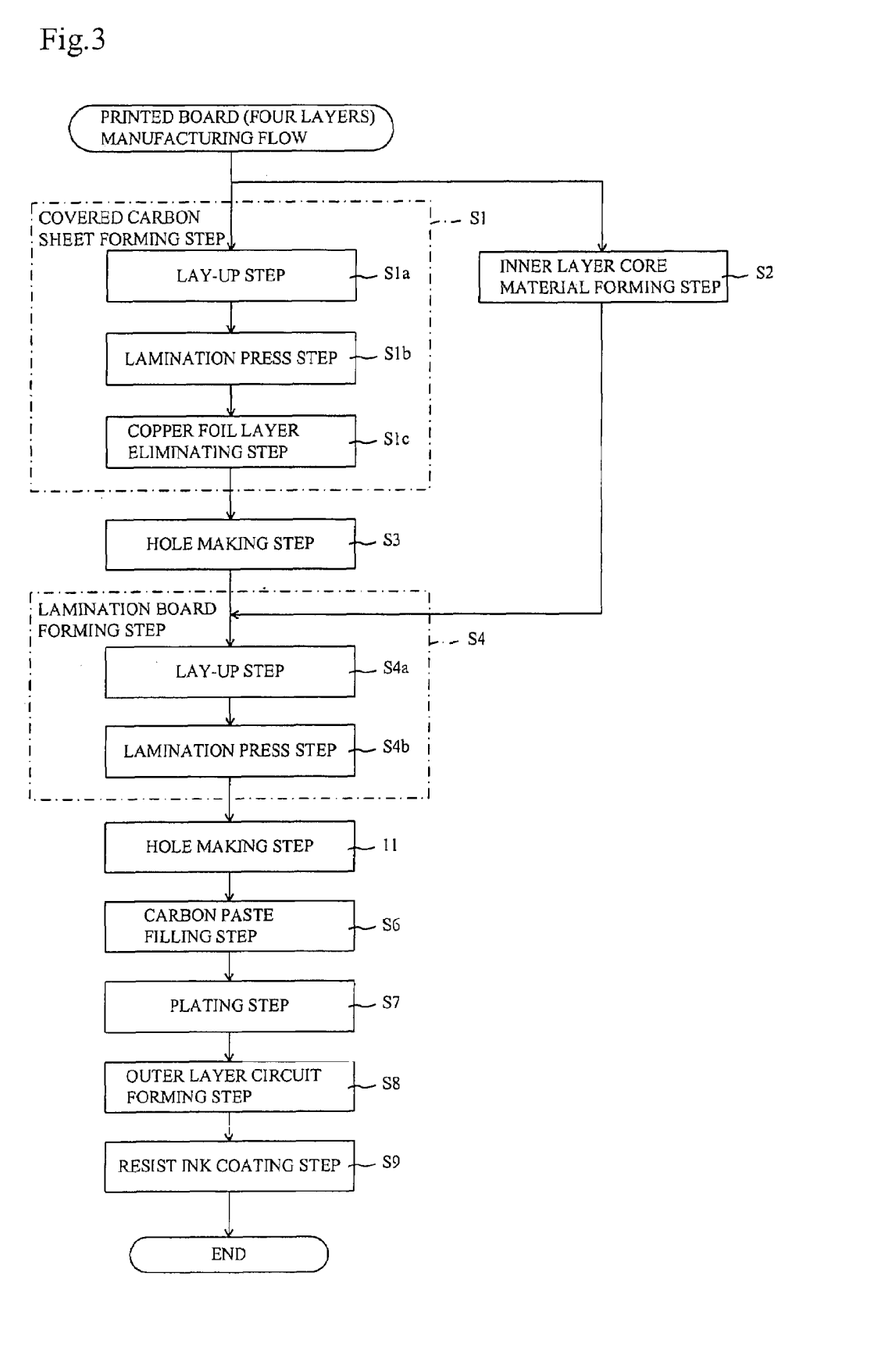
FIG. 3 is a flowchart of steps in a method for manufacturing the printed board according to the first embodiment.
Figure 4:
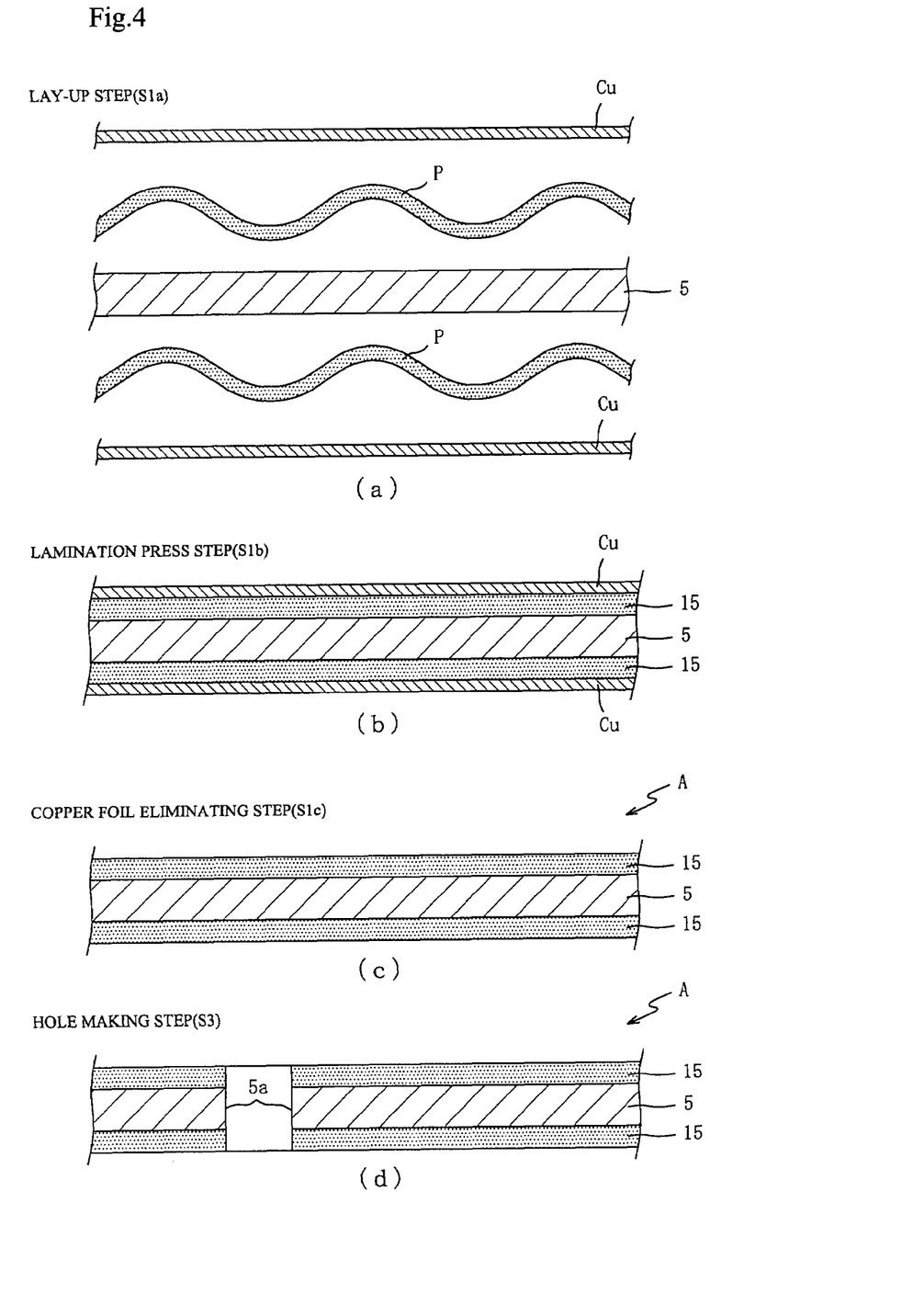
FIG. 4 are schematic views showing steps of forming a covered carbon sheet.
Figure 5:
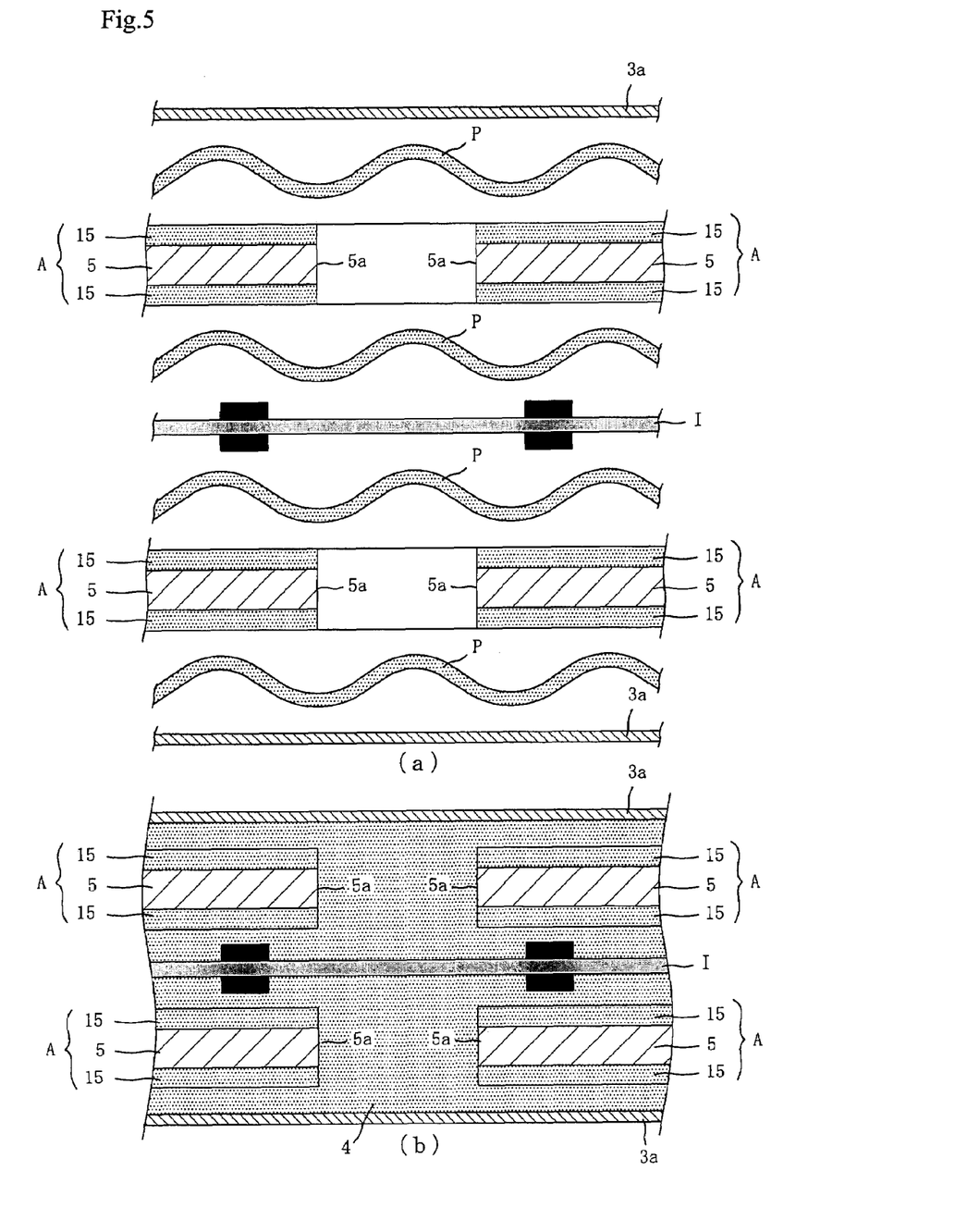
FIG. 5 are schematic views showing steps of forming a laminated board.

FIG. 3 is a flowchart of steps in the method for manufacturing the printed board 1, FIG. 4 are schematic views showing steps of forming the covered carbon sheet A, and FIG. 5 are schematic views showing steps of forming a laminated board.

As shown in FIG. 3, in the method for manufacturing the printed board 1, which is a four-layer printed board, a covered carbon sheet forming step (S1) is first carried out to form the covered carbon sheet A. A lay-up step (S1a) is initially carried out in the covered carbon sheet forming step (S1). The lay-up step (S1a) is a step of laminating a semi-hardened prepreg P obtained by impregnating glass cloth with an epoxy resin, and a copper foil layer Cu (see FIG. 4a) on both surfaces of the carbon sheet 5.

Following the lay-up step (S1a), a lamination press step is carried out (S1b). The lamination press step (S1b) is a step of heat-crimping the carbon sheet 5, prepreg P, and copper foil layer Cu laminated in the lay-up step (S1a), in a vacuum. Hardening the prepreg P by heat-crimping forms the covering layer 15 for covering the carbon sheet 5 (see FIG. 4b). Hardening the prepreg P in the lamination press step (S1b) integrates the laminated layers into one sheet.

Following the lamination press step (S1b), a copper foil layer eliminating step (S1c) is carried out. The copper foil layer eliminating step (S1c) is a step of eliminating the copper foil layer Cu from the sheet (see FIG. 4b) obtained in the lamination press step (S1b) by etching. As a result, the covered carbon sheet A in which the carbon sheet 5 is covered with the covering layer 15 can be obtained (see FIG. 4c).

Since the carbon sheet 5 is a sheet made of only carbon as described above, the carbon sheet 5 is apt to drop off carbon flakes from an edge thereof (peripheral edge or edge of opening 5a) due to weak carbon-to-carbon bonds. However, the carbon sheet 5 is covered with the covering layer 15 in the covered carbon sheet A, whereby the edges of the carbon sheet 5 are reinforced. This can prevent carbon flakes from dropping off.

In the covered carbon sheet forming step (S1), the copper foil layer Cu, which is easy to handle and can easily be eliminated, is used. Therefore, the covered carbon sheet A can easily be manufactured.

Following the covered carbon sheet forming step (S1) (copper foil layer eliminating step (S1c)), a hole making step (S3) is carried out. The hole making step (S3) is a step of making a hole (opening 5a) having a circumference larger than that of the through hole TH provided in the printed board 1, in the covered carbon sheet A obtained in the covered carbon sheet forming step (S1) in such a manner that the hole corresponds to the position of the through hole TH (see FIG. 4d).

Making the hole having a circumference larger than that of the through hole TH onto the covered carbon sheet A (carbon sheet 5) in the hole making step (S3) allows the printed board 1 in which a current from the plating layer 11 is prevented from passing through the carbon sheet 5 to be obtained.

As shown in FIG. 3, in the method for manufacturing the printed board 1 according to the present embodiment, while the covered carbon sheet A is formed in the above-mentioned covered carbon sheet forming step (S1), an inner layer core material forming step is carried out (S2) to form an inner layer core material I (see FIG. 5) provided with the inner conductive pattern on both surfaces.

In the inner layer core material forming step (S2), a coppered board for an inner layer core material is obtained by interposing a prepreg similar to the prepreg P between copper foils, heat-crimping the prepreg and copper foils in a vacuum, and hardening the prepreg. Subsequently, by etching the obtained coppered board for an inner layer core material and thereby forming an inner layer conductive pattern, an inner core material I is formed.

Next, in a laminated board forming step (S4), a coppered laminated board (that corresponds to "laminated board" in CLAIMS) is formed using the covered carbon sheet A having the opening 5a made in the hole making step (S3) and the inner layer core material I formed in the inner layer core material forming step (S2).

In the laminated board forming step (S4), a lay-up step is first carried out (S4a). In the lay-up step (S4a), the covered carbon sheet A having the opening 5a made in the hole making step (S3), the inner layer core material I formed in the inner layer core material forming step, the prepregs P, and the copper foil layers 3a are laminated in the order shown in FIG. 5a.

Following the lay-up step (S4a), a lamination press step is carried out (S4b). The lamination press step (S4b) is a step of heat-crimping the covered carbon sheet A, inner layer core material I, prepregs P, and copper foil layers 3a laminated in the lay-up step (S4a), in a vacuum. The prepregs P are hardened by heat-crimping, whereby the laminated layers are integrated into one coppered laminated board (see FIG. 5b). The insulating board 4 is formed of the prepregs P and the covering layers 15 of the covered carbon sheet A disposed in the laminated press step (S4b).

Following the laminated board forming step (S4), a hole making step is carried out (S5). In the hole making step (S5), the through hole TH for electrically coupling the conductive pattern 3 serving as an outer layer formed in an outer layer circuit forming step (S8) to be discussed later, and the conductive pattern provided on the inner layer core material I is made in a predetermined position of the coppered laminated board formed in the laminated board forming step (S4), and the heat receiving holes 6 and heat radiating holes 7 are made in predetermined positions.

Following the hole making step (S5), a carbon paste filling step (S6) is carried out to fill the heat receiving holes 6 and heat radiating holes 7 with the carbon pastes 8 and hardening the carbon pastes 8. This couples the heat receiving holes 6 and heat radiating holes 7 and the carbon sheet 5 via the carbon pastes 8. Coupling the heat receiving holes 6 and heat radiating holes 7 via the carbon pastes 8 in the carbon paste filling step (S6) allows heat generated by the electronic components 2 to be conducted to the carbon sheet 5 with efficiency. This makes it possible to obtain the printed board 1 that has an excellent heat radiation characteristic.

Next a plating step (S7) is carried out to form the plating layer 3b and plating layer 11 on the copper foil layer 3a and in the through hole TH, respectively. Following the plating step (S6), an outer layer circuit forming step (S8) is carried out to etch the copper foil layer 3a and plating layer 3b to form the conductive pattern 3 serving as an outer layer.

Following the outer layer circuit forming step (S8), a resist ink coating step (S9) is carried out. The resist ink coating step (S9) is a step of coating the conductive pattern 3 serving as an outer layer formed in the outer layer circuit forming step (S8) with resist ink and thereby covering the conductive pattern 3 (copper foil layer 3a and plating layer 3b) with the resist layer 12.

When the conductive pattern 3 is covered with the resist layer 12 in the resist ink coating step (S9), the printed board 1, which is a four-layer printed board, is obtained. The printed board 1 has an excellent heat radiation characteristic, as described above, thanks to the existence of the carbon sheet 5 provided as an inner layer.

Figure 6:
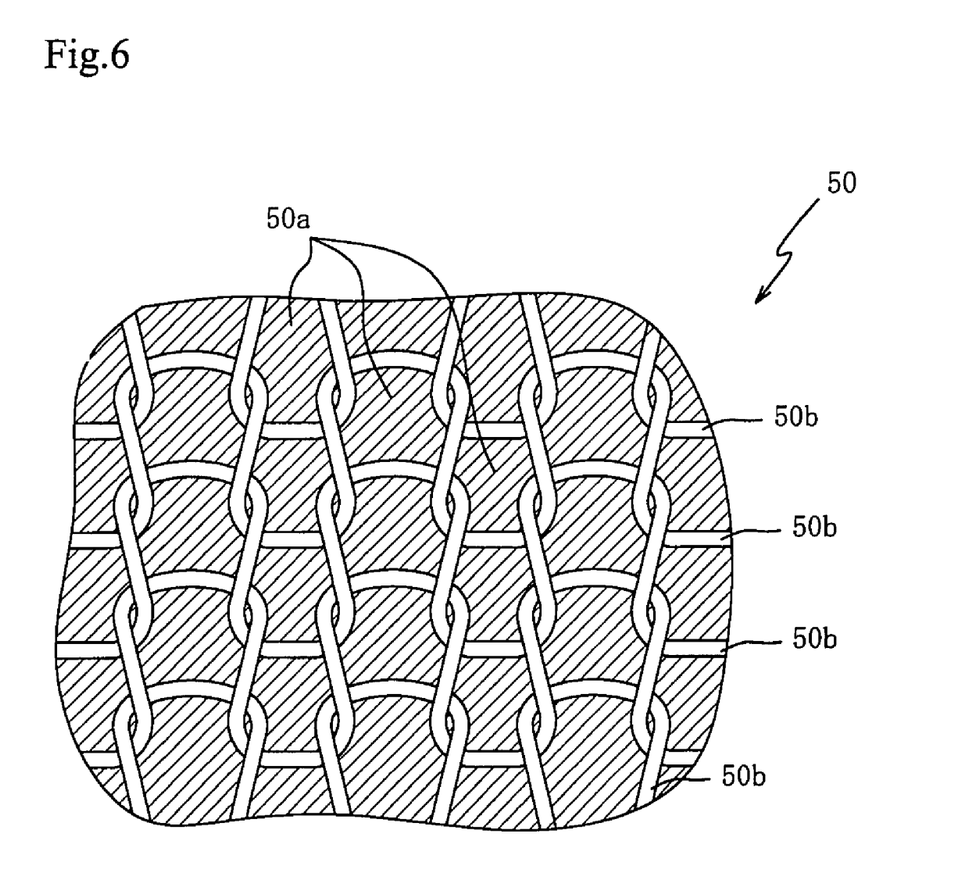
FIG. 6 is a drawing showing a carbon sheet used in a printed board according to a second embodiment.

Now a printed board 1 according to a second embodiment will be described referring to FIG. 6. FIG. 6 is a drawing showing a carbon sheet 50 used in the printed board according to the second embodiment. Same elements as those of the first embodiment described above are given same reference numerals and will not be described.

As described above, the printed board 1 according to the first embodiment uses a sheet made of only carbon as the carbon sheet 5. On the other hand, the printed board according to the second embodiment uses the carbon sheet 50 to be discussed later, instead of the carbon sheet 5.

As shown in FIG. 6, the carbon sheet 50 is a carbon sheet obtained by filling a gap in a network (copper knit) knitted from a copper wire 50b with a carbon containing material 50a and then rolling them.

In the carbon sheet 50, weak carbon-to-carbon bonds are reinforced with the copper wire 50b, so dropping-off of carbon flakes can be prevented more effectively than the carbon sheet 5 made of only carbon. Therefore, using such a carbon sheet 50 can more effectively prevent carbon flakes from dropping off from the covered carbon sheet obtained by covering the carbon sheet 50 with the covering layer 15.

As a result, dropping-off of carbon flakes from the carbon sheet 50 can be prevented more effectively in the laminated board forming step (S4). This can more effectively prevent a printed board 1 having faulty wiring from occurring.

Figure 7:
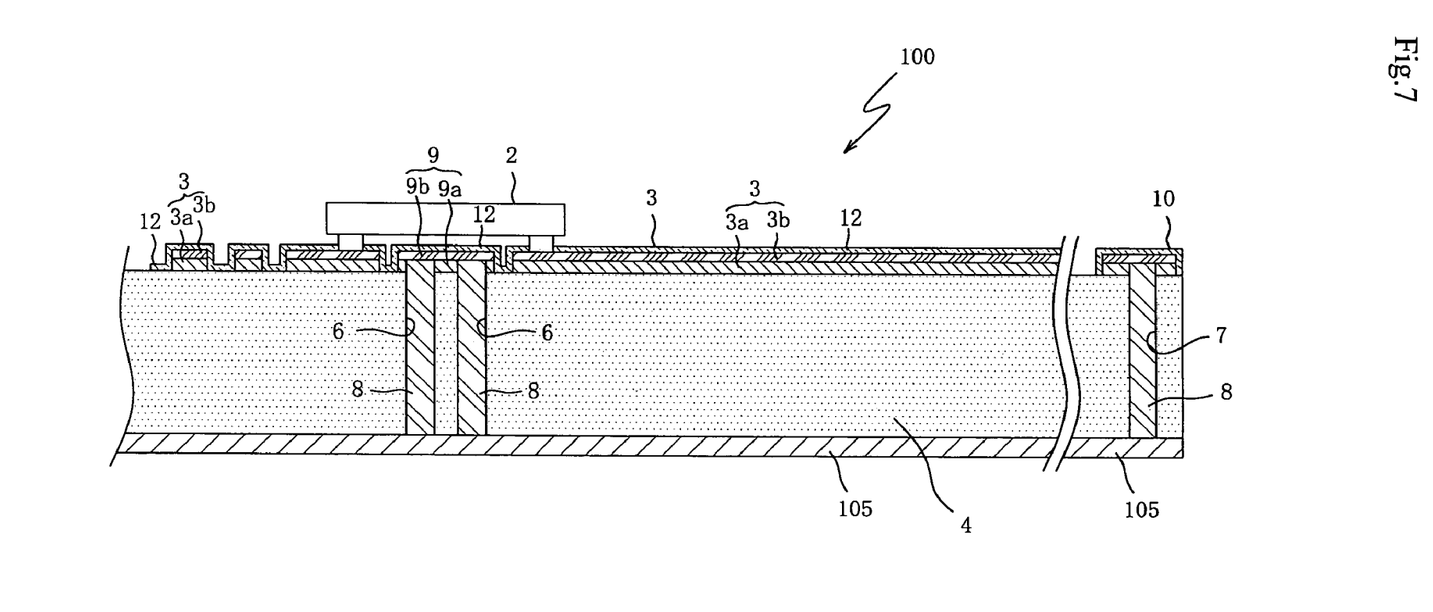
FIG. 7 is a sectional side view of a printed board according to a third embodiment.

Now a third embodiment will be described referring to FIG. 7. FIG. 7 is a sectional side view of a printed board 100 according to the third embodiment. While the printed board 1 according to the first embodiment has the carbon sheet 5 provided inside the insulating board 4 in a laminated form, the printed board 100 according to the third embodiment has the carbon sheet 105 provided on the back surface (lower surface in FIG. 7) of the insulating board 4 in a laminated form. Same elements as those in the first embodiment are given same reference numerals and will not be described.

As shown in FIG. 3, a heat receiving hole 6 according to the third embodiment is formed so as to penetrate the insulating board 4, and an edge thereof (lower side in FIG. 7) is coupled to the carbon sheet 105 to be discussed later. As in the first embodiment, the heat receiving holes 6 are filled with the carbon pastes 8, allowing heat from the electronic components 2 to be conducted to the carbon sheet 5 with reliability and high efficiency.

As shown in FIG. 7, the carbon sheet 105 is provided on the entire back surface (lower side in FIG. 7) of the insulating board 4. The area of the carbon sheet 105 exposed to the outside is much larger than that in the first embodiment. Therefore, heat generated by the electronic components 2 when the electronic components 2 are energized is conducted to the carbons sheet 105 via the heat receiving holes 6 (carbon pastes 8). Then the heat is diffused through the carbon sheet 105, whereby the heat is diffused through the entire region of the printed board 1. This makes it possible to radiate the heat from the carbon sheet 105 to the outside with reliability and high efficiency.

The third embodiment uses the carbon sheet 105 whose surfaces are not covered with covering layers (covering layers 15 in the first embodiment) made of an insulating material. However, a carbon sheet 105 previously covered with an insulating material may be used. As in the first embodiment described above, using the carbon sheet 105 previously covered with an insulating material can prevent carbon flakes from dropping off from an edge thereof. This can prevent faulty wiring from occurring in the printed board 1 due to a dropped-off carbon flake.

The laminated board forming step (S4) in the flowchart of FIG. 3 corresponds to the printed board-use laminated board forming step set forth in the claim. The covered carbon sheet forming step (Sl) in the flowchart of FIG. 3 corresponds to the covered carbon-containing material forming step set forth in the claim. Further, the hole making step (S3) in the flowchart of FIG. 3 corresponds to the covered carbon-containing material hole making step set forth in the claim.

The lay-up step (S1a) in the flowchart of FIG. 3 corresponds to the laminating step set forth in claim 14. The lamination press step (S1b) in the flowchart of FIG. 3 corresponds to the crimping step set forth in claim 14. The copper foil layer eliminating step (S1c) in the flowchart of FIG. 3 corresponds to the metal sheet elimination step set forth in claim 14.

The hole making step (S3) in the flowchart of FIG. 3 corresponds to the covered carbon containing material hole making step set forth in the claim. The resist ink coating step (S9) in the flowchart of FIG. 3 corresponds to the solder resist film forming step set forth in the claim.

The hole making step (S5) in the flowchart of FIG. 3 corresponds to the conduction hole making step set forth in claim 17. The plating step (S7) in the flowchart of FIG. 3 corresponds to the plating step set forth in claim 17.

The hole making step (S5) in the flowchart of FIG. 3 corresponds to the heat radiation cavity making step set forth in claim 18. The carbon paste filling step (S6) in the flowchart of FIG. 3 corresponds to the heat radiating material filling step set forth in claim 18.

While the present invention has been described based on the embodiments, the invention is not limited to the above-mentioned embodiments. It can easily be presumed that various modifications can be made to these embodiments without departing from the spirit and scope of the invention.

For example, in the printed board 1 according to the above-mentioned first embodiment, a heat receiving hole 6 and a heat radiating hole 7 are formed as one through hole in which these holes communicate with each other as shown FIG. 2. This is because these holes 6,7 can be made by drilling in one process simultaneously, whereby the need to perform separate processes to make both holes, 6,7 is eliminated, that is, the process steps are simplified. Therefore, the processing cost can be reduced accordingly.

How these holes are made is not limited to the embodiment. As a matter of course, recesses can independently be made in different positions to provide the heat receiving holes 6 and heat radiating holes 7 as holes each having a depth up to or down to the carbon sheet 5. For example, the number of recesses made in the lower surface (lower surface in FIG. 2) of the insulating board 4 to provide the heat radiating holes 7 may be larger than the number of recesses made in the upper surface (upper surface in FIG. 2) of the insulating board 4 to provide the heat receiving holes 6. This makes it possible to radiate heat from the carbon sheet 5 to the outside with more efficiency. In this case, to provide the heat radiating holes 7, recesses may be made in an identical surface (upper surface in FIG. 2) to the surface in which recesses are made to provide the heat receiving holes 6.

Further, in the printed board 1 according to the above-mentioned first embodiment, a part of an edge of the carbon sheet 5 extends out from an peripheral edge (right side in FIG. 2) of the insulating board 4. However, the aspect of the edge of the carbon sheet 5 is not necessarily limited to what is described above. As a matter of course, the carbon sheet 5 can be formed so that no parts of the edge of the carbon sheet 5 extend out from the peripheral edge of the insulating board 4. This preferably eliminates the need to consider a contact (conduction) with the carbon sheet 5 when an end face terminal (conductive pattern) is formed at the peripheral edge of the insulating board 4.

Further, in the printed board 1 according to the above-mentioned first embodiment, the heat radiating holes 7 are provided in an surface (lower surface in FIG. 2) opposite to the surface of the insulating board 4 on which the electronic components 2 are packaged. However, the heat radiating holes 7 may not be provided in the surface opposite to such an electronic component packaging surface. In other words, the heat radiating holes 7 are not provided, or these holes are provided only in an identical surface (upper surface in FIG. 2) to the surface on which the electronic components 2 are packaged. As a result, when the surface (lower surface in FIG. 2) opposite to such an electronic component packaging surface is surrounded by a housing or the like, heat radiated from the heat radiating hole 7 can be prevented from accumulating between the housing and the surface of the insulating board 4 that faces the housing.

Further, the printed boards 1, 100 according to the above-mentioned embodiments each have the heat receiving holes 6 and heat radiating holes 7. However, the printed boards 1, 100 are not limited to those embodiments. As a matter of course, either or both of the heat receiving holes 6 and heat radiating holes 7 can be omitted.

Further, in the printed boards 1, 100 according to the above-mentioned embodiments, the heat receiving holes 6 and heat radiating holes 7 are filled with the carbon pastes 8. However, the printed boards 1, 100 are not limited to those embodiments. As a matter of course, the heat receiving holes 6 and heat radiating holes 7 can be filled with metal pastes instead of the carbon sheets 8. Such metal pastes include pastes containing copper or silver.

If one printed board 1 or 100 has a plurality of heat receiving holes 6 or heat radiating holes 7, all the hear receiving holes 6 or heat radiating holes 7 need not be filled with an identical type of pastes (metal pastes or carbon pastes 8). As a matter of course, both the metal pastes and carbon pastes 8 can be used in one printed board 1 or 100.

In the first embodiment, an epoxy resin is used as an insulating resin included in the prepreg P. However, this does not mean that the insulating resin is limited to an epoxy resin. As a matter of course, the prepreg P can be formed using an electrical insulating resin such as a phenol resin or deformed polyimide or polyimide instead of an epoxy resin.

Further, in the first embodiment, the prepreg P including an epoxy resin is used in the covered carbon sheet forming step (S1) and laminated board forming step (S4). However, the insulating resin included in the prepreg P for forming the covering layer 15 may be different from the insulating resin included in the prepreg P for forming a laminated board.

Further, in the first embodiment, a sheet made of only carbon is used as the carbon sheet 5. However, the carbon sheet 5 is not necessarily limited to a sheet made of only carbon. As a matter of course, it can be presumed that a sheet formed by mixing carbon with other materials is used as the carbon sheet 5. In other words, the carbon sheet 5 preferably includes at least carbon.

Similarly in the carbon sheet 50 used in the second embodiment, the carbon containing material 50a filling the network knitted from the copper wire 50b may be made of only carbon or a mixture of carbon and other materials.

Further, in the carbon sheet 50 used in the second embodiment, the network knitted from the copper wire 50b is filled with the carbon containing material 50a. However, the member forming the network is not limited to the copper wire 50b. As a matter of course, it can be presumed that the copper wire 50b can be replaced with a material having heat conductivity. For example, a metal wire such as a silver wire may be used instead of the copper wire 50b. Further, the mesh form of the network is not limited to the knit form shown in FIG. 6. As a matter of course, it can be presumed that the network can take other mesh forms.

Further, as the method for manufacturing the printed board 1 according to the above-mentioned first embodiment, the method for manufacturing a four-layer printed board is shown above. However, as a matter of course, it can be presumed that the method for manufacturing the printed board 1 according to the first embodiment can be applied to methods for manufacturing a single-sided board, a double-sided board, and multilayer boards other than the four-layer board.

In the printed board 1 according to the above-mentioned first and second embodiments, one carbon sheet 5 or 50 is provided between layers of conductive pattern (surface layer conductive pattern 3 (copper foil 3a) and conductive pattern in the inner layer core material I) with an insulating board 4 interposed between one conductive pattern and one carbon sheet 5 or 50 (see FIG. 2 or FIG. 5b). The position in which the carbon sheet 5 or 50 is provided is not limited to these embodiments. At least one carbon sheet 5 or 50 is preferably provided in a position separate from a conductive pattern (surface layer conductive pattern 3 (copper foil 3a) and conductive pattern in the inner layer core material I) with an insulating board 4 interposed between a conductive pattern and a carbon sheet 5 or 50.

For example, one of the two layers of carbon sheet 5 (covered carbon sheet A) provided in the coppered laminated board for a four-layer printed board shown in FIG. 5b may not be provided. Further, a carbon sheet 5 or 50 may be provided on a surface of a one-sided board on which no conductive pattern is provided.

In the printed board 1 according to the above-mentioned first and second embodiments, one carbon sheet 5 or 50 is provided between layers of conductive pattern (surface layer conductive pattern 3 (copper foil 3a) and conductive pattern in the inner layer core material I) with an insulating board 4 interposed between one conductive pattern and the carbon sheet 5 or 50 (see FIG. 2 or FIG. 5b). However, how the carbon sheet 5 or 50 is provided is not limited to these embodiments. Two or more layers of carbon sheet 5, 50 may be provided between layers of conductive pattern (surface layer conductive pattern 3 (copper foil 3a) and conductive pattern in the inner layer core material I) with an insulating board 4 between each carbon sheet and a layer of conductive pattern. Alternatively the carbon sheets 5 or 50 may be combined and provided in a laminated form.

Further it can be easily presumed that the printed boards 1, 100 according to the above-mentioned embodiments, that is, printed boards 1, 100 having the carbon sheet 5, 50, or 105 provided therein or thereon can be applied to a one-sided board, a double-sided board, and multilayer boards.

The invention claimed is:

1. A printed board that includes an insulator made of an electrical insulating material and a wiring pattern formed on at least one surface of the insulator or on at least one surface of the insulator and inside the insulator and on which one or more electronic components are to be mounted, the printed board comprising:
    a sheet-shaped carbon layer principally made of carbon and obtained by rolling,
    wherein the carbon layer is provided at least inside the insulator in a laminated form, and
    wherein the carbon layer provided inside the insulator in a laminated form is obtained by previously covering both surfaces of a sheet-shaped carbon layer obtained by rolling with a covering layer made of the electrical insulating material and then interposing the carbon layer covered with the covering layer between the electrical insulating materials and crimping the carbon layer and the electrical insulating material.

2. The printed board according to claim 1, further comprising:
    a heat receiving hole that is recessed or drilled in a thickness direction of the insulator, the heat receiving hole being connected to the carbon layer provided inside the insulator or on a surface of the insulator in a laminated form,
    wherein the heat receiving hole has an opening that is formed so as to face a back surface of the electronic component, and
    the heat receiving hole is filled with a metal paste or a carbon paste.

3. The printed board according to claim 1, further comprising:
    a heat radiating hole which is recessed or drilled in a thickness direction of the insulator, the heat radiating hole being connected to the carbon layer provided inside the insulator or on a surface of the insulator in a laminated form,
    wherein the heat radiating hole has an opening that is formed so as not to face a back surface of the electronic component by providing the opening on a surface opposite to a surface on which the electronic component is packaged or providing the opening in a position that does not overlap the electronic component when seen from above on a identical surface to the surface on which the electronic component is packaged, and
    the heat radiating hole is filled with a metal paste or a carbon paste.

4. The printed board according to claim 3,
    wherein if the carbon layer is provided inside the insulator in a laminated form, the heat receiving hole and the heat radiating hole connected to the carbon layer are formed as one through hole in which the heat receiving hole and the heat radiating hole communicate to each other.

5. The printed board according to claim 2,
    wherein a top of the metal paste or carbon paste filling the heat receiving hole is raised from a surface of the insulator so as to reduce a gap between the metal paste or carbon paste and a back surface of the electronic component.

6. The printed board according to claim 2,
    wherein a top of the metal paste or carbon paste filling the heat receiving hole is raised from a surface of the insulator so as to be approximately as high as or slightly higher than the wiring pattern so that the top can directly or indirectly make contact with a back surface of the electronic component.

7. The printed board according to claim 2, further comprising:
    a heat receiving pattern formed on a surface of the insulator so as to face a back surface of the electronic component, the heat receiving pattern being coupled to a plurality of metal pastes or carbon pastes filling the heat receiving hole,
    wherein the heat receiving pattern is formed approximately in a form of a plane over a range including the plurality of metal pastes or carbon pastes when seen from above.

8. The printed board according to claim 1,
    wherein at least a part of the carbon layer provided inside the insulator in a laminated form is formed so as to extend out from a peripheral edge of the insulator.

9. The printed board according to claim 1,
    wherein the wiring pattern includes a ground pattern coupled to a ground, and
    the ground pattern and the carbon layer are electrically coupled to each other.

10. The printed board according to claim 9,
    wherein a part or all of the heat radiating hole is recessed or drilled in the thickness direction of the insulator while penetrating the ground pattern, and
    the ground pattern and the carbon layer are electrically coupled to each other via the metal paste or carbon paste filling the heat radiating hole.

11. The printed board according to claim 1,
    wherein the carbon layer is provided over an almost entire region inside the insulator or on a surface of the insulator in a laminated form except for proximity of the wiring pattern when the wiring pattern is formed inside the insulator.

12. The printed board according to claim 1, further comprising:
a conduction hole for electrically coupling the wiring pattern layers provided so as to be insulated from each other by interposition of the insulator,
wherein the carbon layer provided inside the insulator in a laminated form is obtained by previously covering both surfaces of a sheet-shaped carbon layer obtained by rolling with a covering layer made of the electrical insulating material by crimping and making a hole having a circumference larger than a circumference of the conduction hole at a position corresponding to the conduction hole, and then interposing the carbon layer in which the hole is made between the electrical insulating materials and crimping the carbon layer and the electrical insulating material.

13. The printed board according to claim 1,
wherein the carbon layer is a carbon layer obtained by filling a gap in a network knitted from a heat conductive material with a material principally made of carbon.

* * * * *